United States Patent
Son et al.

(10) Patent No.: US 9,335,951 B2
(45) Date of Patent: May 10, 2016

(54) MEMORY DEVICE FOR REDUCING A WRITE FAIL, A SYSTEM INCLUDING THE SAME, AND A METHOD THEREOF

(71) Applicant: SAMSUNG ELECTRONICS CO., LTD., Gyeonggi-do (KR)

(72) Inventors: Jong Pil Son, Hwaseong-si (KR); Chul Woo Park, Hwaseong-si (KR); Hak Soo Yu, Hwaseong-si (KR); Hong Sun Hwang, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 152 days.

(21) Appl. No.: 14/013,275

(22) Filed: Aug. 29, 2013

(65) Prior Publication Data

US 2014/0068203 A1 Mar. 6, 2014

(30) Foreign Application Priority Data

Aug. 29, 2012 (KR) ........................ 10-2012-0095223

(51) Int. Cl.
*G06F 3/00* (2006.01)
*G06F 3/06* (2006.01)
*G11C 7/00* (2006.01)
*G11C 11/4076* (2006.01)
*G06F 13/16* (2006.01)

(52) U.S. Cl.
CPC ............ *G06F 3/0659* (2013.01); *G06F 3/0604* (2013.01); *G06F 3/0676* (2013.01); *G06F 13/1642* (2013.01); *G11C 7/00* (2013.01); *G11C 11/4076* (2013.01)

(58) Field of Classification Search
None
See application file for complete search history.

(56) References Cited

U.S. PATENT DOCUMENTS

| | | | |
|---|---|---|---|
| 6,360,305 B1 * | 3/2002 | Novak et al. ................. | 711/157 |
| 6,496,906 B1 | 12/2002 | Novak et al. | |
| 6,661,721 B2 * | 12/2003 | Lehmann ........... | G11C 11/4094 365/203 |
| 7,161,860 B2 * | 1/2007 | Ha et al. ........................ | 365/203 |
| 7,644,248 B2 | 1/2010 | Subaschandrabose et al. | |
| 7,711,899 B2 | 5/2010 | Ishizuka et al. | |
| 2009/0319730 A1 | 12/2009 | Tanaka et al. | |
| 2009/0327623 A1 * | 12/2009 | Ochiai ................ | G06F 13/1668 711/154 |
| 2012/0105914 A1 * | 5/2012 | Sato .......................... | G06F 1/12 358/1.16 |

FOREIGN PATENT DOCUMENTS

| | | |
|---|---|---|
| JP | 2004500667 | 1/2004 |
| JP | 2006260159 | 9/2006 |
| JP | 2006-268734 | 10/2006 |
| JP | 2008015699 | 1/2008 |
| JP | 2009259114 | 11/2009 |
| JP | 2010003067 | 1/2010 |
| JP | 2011060162 | 3/2011 |
| KR | 1019990079983 | 11/1999 |

* cited by examiner

*Primary Examiner* — Elias Mamo
(74) *Attorney, Agent, or Firm* — F. Chau & Associates, LLC

(57) ABSTRACT

A memory system includes a memory device and a memory controller. The memory device includes a plurality of memory cells. The memory controller is configured to continuously perform a plurality of write commands on the memory device between an active command and a precharge command. In the memory system, when after a first write operation having a last write command of the plurality of write commands is performed and then the precharge command is issued, the last write command is issued for a second write operation after the precharge command. The first write operation and the second write operation write a same data to memory cells of plurality of memory cells having a same address.

15 Claims, 22 Drawing Sheets

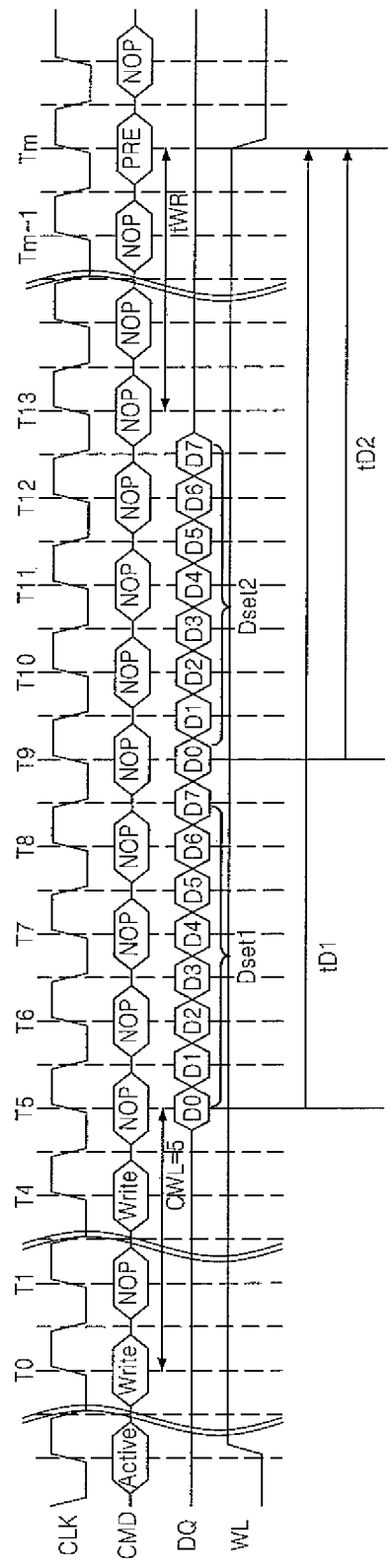
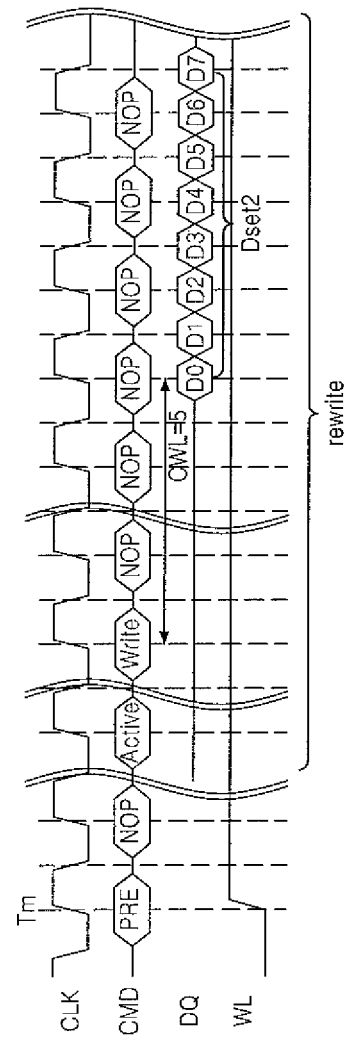

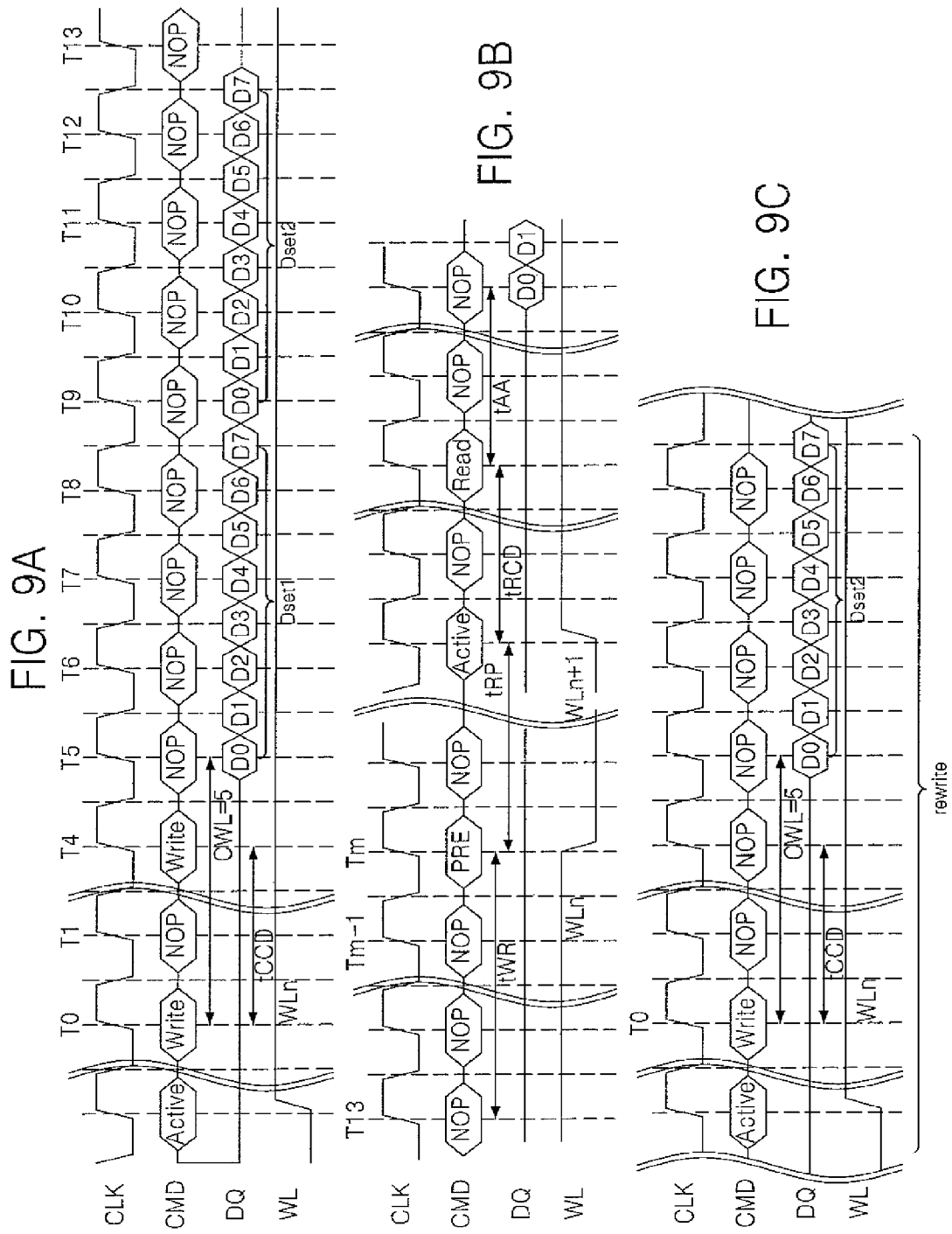

FIG. 12A

| Write command | BA | RA | CA |
|---|---|---|---|
| A task | BA00 | RA0000 | CA0000 |
| B task | BA00 | RA0001 | CA0000 |
| C task | BA00 | RA0000 | CA0001 |
| D task | BA00 | RA0001 | CA0001 |
| E task | BA01 | RA0000 | CA0000 |
| F task | BA01 | RA0001 | CA0000 |
| G task | BA01 | RA0000 | CA0001 |
| H task | BA01 | RA0001 | CA0001 |

| Write command | RA , BA, CA |
|---|---|
| Task 6 | RA0 BA1 CA0 |
| Task 5 | RA1 BA1 CA0 |
| Task 4 | RA1 BA1 CA0 |
| Task 3 | RA0 BA0 CA2 |
| Task 2 | RA0 BA0 CA1 |
| Task 1 | RA0 BA0 CA0 |

MEMORY DEVICE FOR REDUCING A WRITE FAIL, A SYSTEM INCLUDING THE SAME, AND A METHOD THEREOF

CROSS-REFERENCE TO RELATED APPLICATION

This application claims priority under 35 U.S.C. §119(a) to Korean Patent Application No. 10-2012-0095223 filed on Aug. 29, 2012 in the Korean Intellectual Property Office, the disclosure of which is incorporated by reference herein in its entirety.

TECHNICAL FIELD

The present inventive concept relates to a memory device, and more particularly, to a method of writing data to a memory device.

DISCUSSION OF RELATED ARTS

The increased degree of integration of semiconductor devices has reduced elements in size and a gap between elements. For example, dynamic random access memory (DRAM) device decreases in size, contact resistance and bit line resistance of a DRAM write path, thereby increasing a write time through the DRAM write path. Further, as the size of cell transistors is reduced to increase the degree of integration of semiconductor devices, the driving performance of the cell transistors decreases. Accordingly, semiconductor devices may need more time for a write operation.

SUMMARY

According to an exemplary embodiment of the inventive concept, a memory system includes a memory device and a memory controller. The memory device includes a plurality of memory cells. The memory controller is configured to continuously perform a plurality of write commands on the memory device. In the memory system, the memory device performs a first write operation corresponding to a last write command of the plurality of write commands, performs a precharge operation and then performs a second write operation corresponding to the last write command after the precharge operation. The first write operation and the second write operation write a same data to memory cells of plurality of memory cells having a same address.

The precharge operation may be performed in response to a precharge command issued from the memory controller or an internally generated precharge command in the memory device.

According to an exemplary embodiment of the inventive concept, a method of writing data to a memory device is provided. A word line in a memory bank is activated in response to an active command. A plurality of data sets is continuously written to memory cells associated with the word line in response to a corresponding write command of a plurality of write commands. The word line is precharged after a last write command of the plurality of write commands is performed. In response to the last write command, the last data set is written to the memory cells after the precharging.

The precharging maybe performed in response to a precharge command issued from a memory controller or an internally generated precharge command in the memory device.

According to an exemplary embodiment of the inventive concept, a method of writing data to a memory device is provided. A plurality of write requests and a plurality of data sets are received from a host. A sequence of a plurality of write commands from the plurality of write requests is generated according to a predetermined scheduling method and the sequence is applied to a memory device between an active command and a precharge command. A last write command of the plurality of write commands is applied to the memory device after the precharge command.

According to an exemplary embodiment of the inventive concept, a memory controller includes an arbiter. The arbiter is configured to generate an active command, a precharge command, and a plurality of write commands having a common row address and configured to continuously issue the plurality of write commands between the active command and the precharge command, wherein the precharge command is issued after a first write operation is performed in response to a last write command of the plurality of write commands, the last write command is issued for a second write operation after the precharge command, and wherein the first write operation and the second write operation write a same data set to memory cells of plurality of memory cells having a same column address.

BRIEF DESCRIPTION OF THE DRAWINGS

These and other features of the inventive concept will become more apparent by describing in detail exemplary embodiments thereof with reference to the accompanying drawings of which:

FIGS. 8A and 8B are signal timing charts illustrating a data write operation according to an exemplary embodiment of the inventive concept;

FIGS. 9A through 9C are signal timing charts illustrating a data write operation according to an exemplary embodiment of the inventive concept;

FIGS. 12A through 12C are diagrams for explaining a method of scheduling a write operation according to an exemplary embodiment of the inventive concept;

DETAILED DESCRIPTION OF THE EMBODIMENTS

Figure 1:
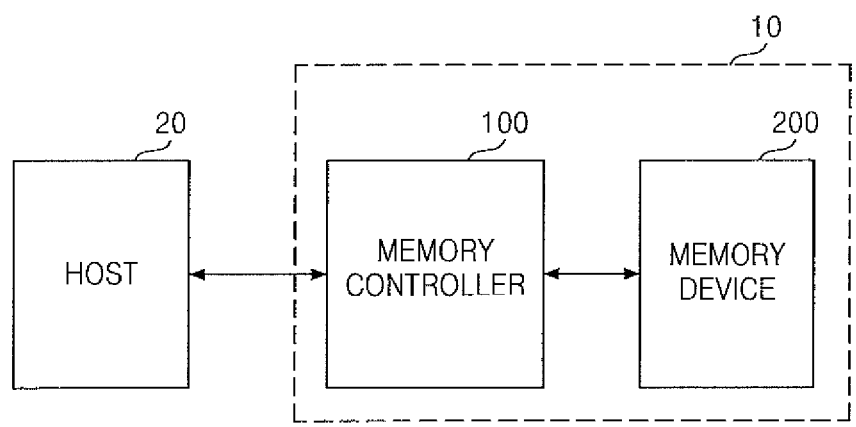
FIG. 1 is a block diagram of a memory system according to an exemplary embodiment of the inventive concept.

Exemplary embodiments of the inventive concept will be described below in more detail with reference to the accompanying drawings. This inventive concept may, however, be embodied in different forms and should not be construed as limited to the embodiments set forth herein. In the drawings, the size and relative sizes of layers and regions may be exaggerated for clarity. Like numbers may refer to like elements throughout the specification and drawings.

It will be understood that when an element is referred to as being "connected" or "coupled" to another element, it can be directly connected or coupled to the other element or intervening elements may be present.

Figure 2:
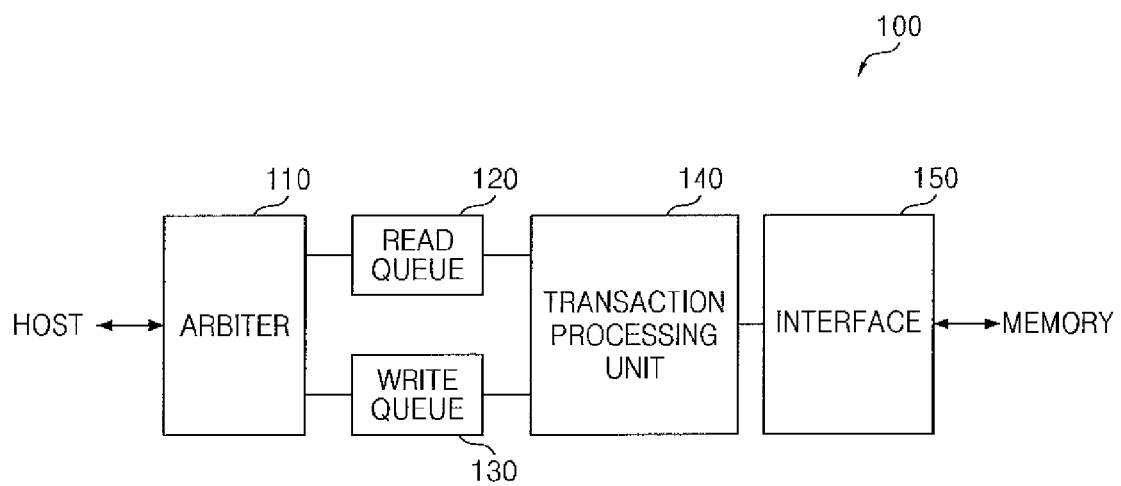
FIG. 2 is a block diagram of a memory controller according to an exemplary embodiment of the inventive concept.
Figure 3:
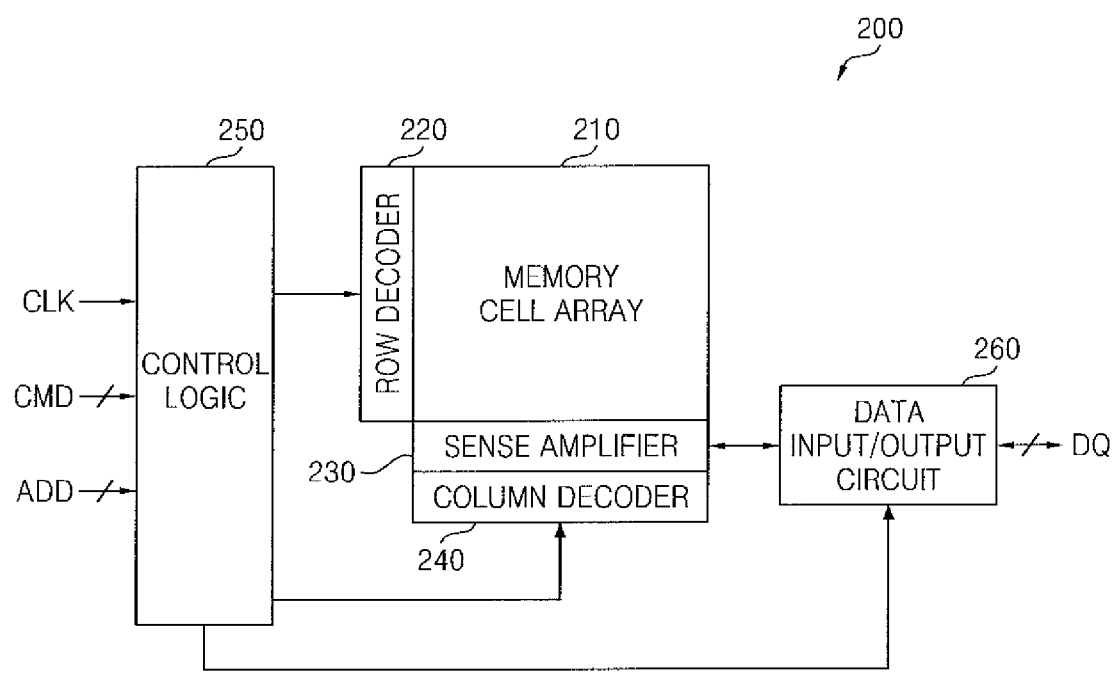
FIG. 3 is a block diagram of a memory device according to an exemplary embodiment of the inventive concept.

As used herein, the singular "a", "an" and "the" are intended to include the plural forms as well, unless the context clearly indicates otherwise FIG. 1 is a block diagram of a memory system 10 according to an exemplary embodiment of the inventive concept. FIG. 2 is a block diagram of a memory controller 100 according to an exemplary embodiment of the inventive concept. FIG. 3 is a block diagram of a memory device 200 according to an exemplary embodiment of the inventive concept. Referring to FIGS. 1 through 3, the memory system 10 includes the memory controller 100 and the memory device 200.

The memory controller 100 includes an arbiter 110, a command queue, a transaction processing unit 140, and a memory interface 150. The command queue includes a write queue 130 and a read queue 120, as illustrated in FIG. 2. In an exemplary embodiment, the write queue 130 and the read queue 120 may be integrated into a single queue.

The arbiter 110 receives a write request and a read request and generates a write command from the write request and a read command from the read request, sequentially storing the read command to the read queue 120 and the write command to the write queue 130. The read queue 120 may store a read command and an address. The write queue 130 may store a write command, an address, and write data. In an exemplary embodiment, the write data may be stored in a memory (e.g., a data queue or buffer (not shown)) while the write command and the address are stored in the write queue 130.

The arbiter 100 schedules or re-orders the sequence of the read and/or write commands stored in the queues 120 and 130 according to a predetermined scheduling algorithm and stores the commands.

The memory controller 100 generates and executes other commands to control the operations of the memory device 200. For instance, when the memory device 200 includes a DRAM device, the arbiter 110 also generates an active command and a precharge command to open and close each row to execute a read or write request from the host. The arbiter 110 schedules commands from the requests received from the host 20 and the active and precharge commands according to a predetermined scheduling method. The arbiter 110 transmits the commands including an active command, a read/write command, and a precharge command according to the scheduling method to the memory device 200 via the memory interface 150 to control the operations of the memory device 200.

The transaction processing unit 140 prepares the memory device 200 to execute the commands CMD output from the arbiter 110. The transaction processing unit 140 may serve to provide data to the host 20 without accessing the memory device 200. For example, when receiving a read request from the host 20 with respect to write data that has been stored in the write queue 130, in other words, write data that has not been written to the memory device 200, the memory controller 100 may read the data from the write queue 130 and transmit it to the host 20 without accessing the memory device 200.

The memory controller 100 may execute a read command prior to any other commands before a write command among multiple read or write requests received from the host 20. The memory controller 100 stores a write command in the write queue 130 and then schedules an execution sequence of commands stored in the write queue 130 according to a predetermined scheduling method. For example, a write command stored in the write queue 130 may be executed according to the priority determined by the scheduling method of the memory controller 100 and then the write command may be erased from the write queue 130.

A pointer designating a write command entry in the write queue 130 may be sequentially increased. For instance, once a write command designated by a pointer in the write queue 130 is executed, the pointer may be shifted to a next write command entry. However, after a write command (e.g., a write command right before a precharge command) is executed at a last write cycle in which a write recovery time (tWR in FIGS. 8A and 9B) is not sufficient, the memory controller 100 does not shift the pointer to a next entry but controls the write command to be executed again. For example, when a write command entry corresponds to data written right before the precharge of the memory device 200 and the memory controller does not have sufficient time to write the data, the memory controller 100 re-executes the write command by retaining the write command entry in the write queue 130 instead of erasing it after the write command corresponding to the entry is executed. In an exemplary embodiment, the memory controller 100 may execute the write command entry after execution of any other command following the precharge. The precharge may be performed in response to a precharge command issued from the memory controller 100 or an internally generated precharge command in the memory device 200. For example, an auto-precharge operaion may be performed by an internally generated precharge command without a precharge command issued from the memory controller 100.

The memory device 200 includes a memory cell array 210, a row decoder 220, a sense amplifier 230, a column decoder 240, a control logic 250, and a data input/output circuit 260. The operations of the memory device 200 will be described later.

The memory cell array 210 is a data storage area in which memory cells are arranged in a row direction and a column direction. The sense amplifier 230 senses and amplifies data in the memory cells and stores data in the memory cells. The memory cell array 210 illustrated in FIG. 3 may include a plurality of (e.g., 4 or 8) memory banks, but the inventive concept is not restricted to the 4 or 8 memory banks.

Data DQ, input through the data input/output circuit 260, is written to the memory cell array 210 based on an address signal ADD. The data DQ read from the memory cell array 210 based on the address signal ADD is output through the data input/output circuit 260.

The address signal ADD is input to an address buffer (not shown) to designate a memory cell to or from which data will be written or read. The address buffer temporarily stores the address signal ADD.

The row decoder 220 decodes a row address in the address signal ADD output from the address buffer to designate a word line connected to a memory cell to or from which data will be input or output. For example, the row decoder 220 decodes a row address output from the address buffer and enables a word line in a data write or read mode.

The column decoder 240 decodes a column address in the address signal ADD output from the address buffer to designate a bit line connected to a memory cell to or from which data will be input or output.

The memory cell array 210 outputs data from or writes data to a memory cell designated by a row address and a column address.

The control logic 250 receives and decodes an external command signal CMD, and generates a decoded command signal. The control logic 250 may include a mode register set/extended mode register set (MRS/EMRS) circuit (not shown) which sets an operation mode. The MRS/EMRS circuit sets an internal mode register in response to an MRS/EMRS command for setting the operation mode of the memory device 200 and/or the address signal ADD.

Although not shown in FIG. 3, the memory device 200 may also include a clock circuit that generates a clock signal and a power circuit that receives an external power supply voltage and generates or distributes an internal voltage.

Figure 4:
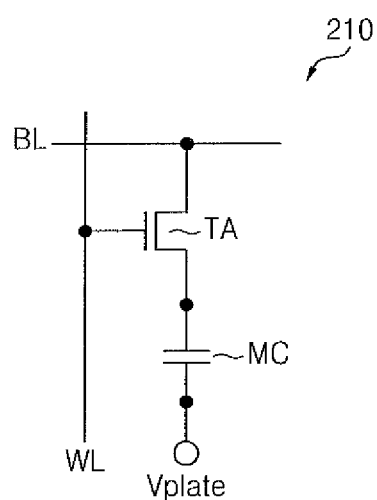
FIG. 4 is a block diagram of a memory cell illustrated in FIG. 3 according to an exemplary embodiment of the inventive concept.

FIG. 4 is a block diagram of a memory cell 210 according to an exemplary embodiment of the inventive concept. Referring to FIG. 4, the memory cell 210 includes an access transistor TA connected to a word line WL and a bit line BL and a memory cell MC selectively connected by the access transistor TA to the bit line BL. The memory cell MC may include a cell capacitor.

Figure 5:
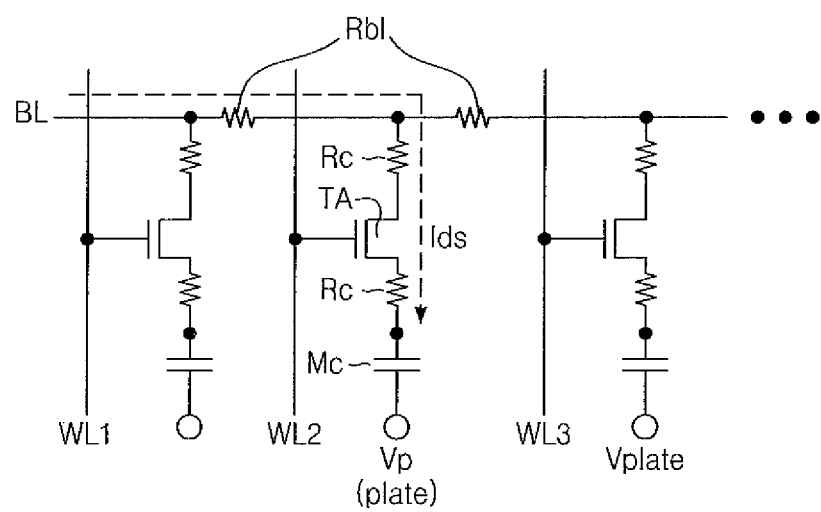
FIG. 5 is a circuit diagram conceptually showing a data write path to the memory cell illustrated in FIG. 4.

FIG. 5 is a circuit diagram showing a data write path to the memory cell MC illustrated in FIG. 4. Referring to FIG. 5, data is written to the memory cell MC through the bit line BL and the access transistor TA.

The data write path includes bit line resistance Rbl of the bit line BL and contact resistance Rc between the access transistor TA and the memory cell (or cell capacitor) MC. As the bit line BL gets finer and longer, the bit line resistance Rbl increases. As the contact size of the memory cell MC decreases, the contact resistance Rc increases. Therefore, current Ids flowing to the memory cell MC through the bit line BL decreases as the degree of integration of the memory cell 210 increases. As a result, it takes more time to write data to the memory cell MC through the increased resistance of the data write path. For example, the write recovery time (tWR) needs more clock cycles to correctly write data in the memory cell 210, which will decrease write performance.

Figure 6:
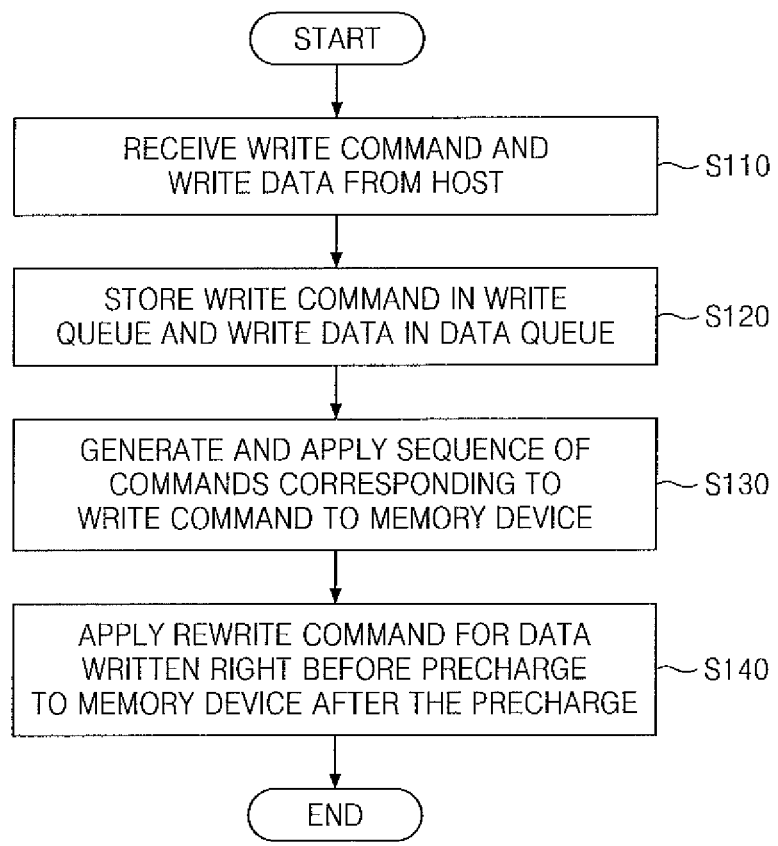
FIG. 6 is a flowchart of a method of writing data to a memory device according to an exemplary embodiment of the inventive concept.

FIG. 6 is a flowchart of a method of writing data to the memory device 200 according to an exemplary embodiment of the inventive concept. Referring to FIGS. 2, 3, and 6, a write command and write data are received from a host in operation S110. The write command is stored in the write queue 130 and the write data is stored in the data queue in operation S120. For instance, the write command and an address are stored in the write queue 130. The address may include a bank address, a row address, and a column address.

The memory controller 100 generates a sequence of commands (e.g., an active command, a write command, and a precharge command) for writing the data to the memory device 200 and applies the sequence of commands to the memory device 200 in operation S130. The memory controller 100, after having issued the precharge command, applies the write command again to correctly write the data to the memory device 200 in operation S140. Hereafter, the repeated write command is interchangeably used as a rewrite command. To rewrite the data written right before the precharge, the memory controller 100 stores the data till the execution of the rewrite command. For example, after the execution of the rewrite command is completed, the memory controller 100 may erase the write command and data.

Figure 7:
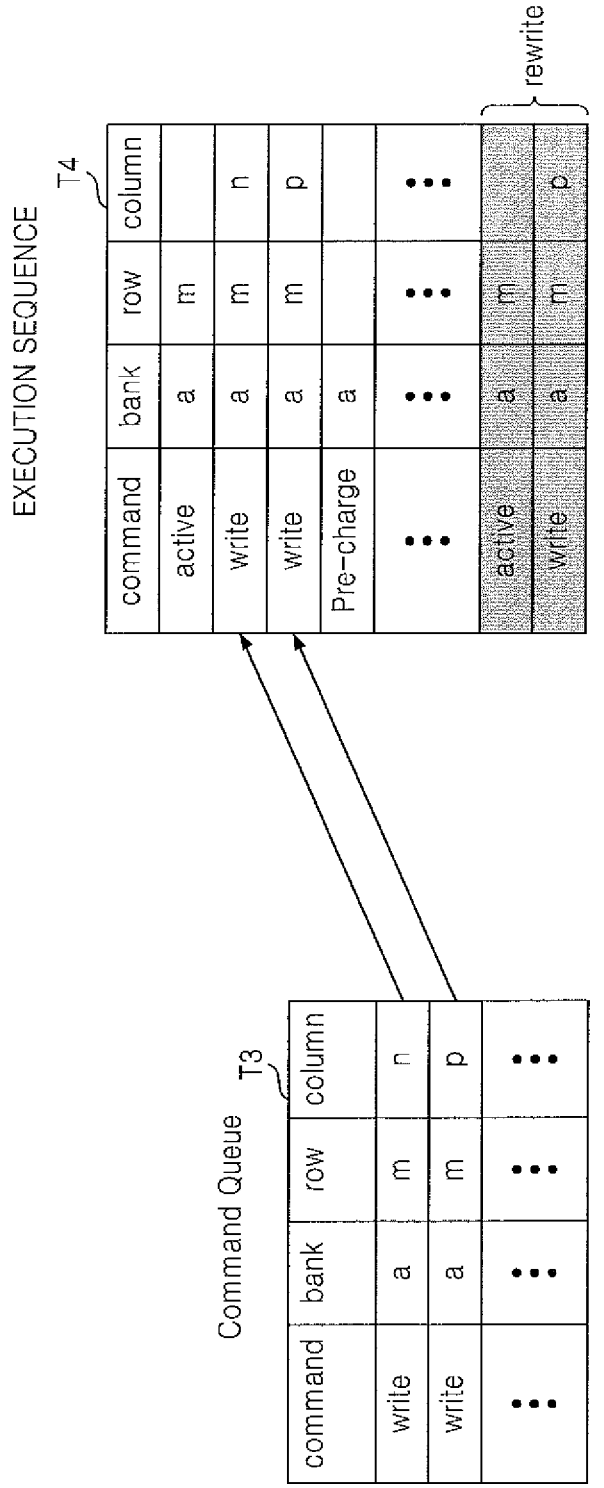
FIG. 7 is a diagram of a command queue and an execution sequence according to an exemplary embodiment of the inventive concept.

FIG. 7 is a diagram of a command queue and an execution sequence according to an exemplary embodiment of the inventive concept. FIGS. 8A and 8B are signal timing charts illustrating a data write operation according to an exemplary embodiment of the inventive concept. In particular, FIG. 8 illustrates the burst write operation of double data rate (DDR) DRAM with a clock write latency (CWL) of 5 and a burst length (BL) of 8.

Referring to FIG. 7 and FIGS. 8A and 8B, write commands "write (a, m, n)" and "write (a, m, p)" are sequentially stored in a write queue as shown in table T3. In response to the write command "write (a, m, n)", data is written to memory cells whose address information includes a bank address of "a", a row address of "m", and a column address of "n". In response to the write command "write (a, m, p)", data is written to memory cells whose address information includes a bank address of "a", a row address of "m", and a column address of "p".

To execute the write commands (e.g., "write (a, m, n)" and "write (a, m, p)" stored in the write queue), the arbiter 110 generates a sequence of commands (or a command sequence) to be applied to the memory device 200. For instance, the arbiter 110 may generate a sequence of commands such as an active command "Active (a, m)", a first write command "write (a, m, n)", a second write command "write (a, m, p)", and a precharge command "Precharge (a)" and apply the sequence of commands to the memory device 200 as illustrated in table T4 of FIG. 7.

Referring to FIGS. 8A and 8B, the command sequence (or an execution sequence) generated by the memory controller 100 may be applied to the memory device 200 in the order of an active command Active, a first write command Write1 at T0, a second write command Write2 at T4, and a precharge command PRE at Tm in synchronization with the clock signal CLK. A no-operation command NOP may be placed between commands (e.g., between the first write command Write1 and the second write command Write2 or the second write command Write2 and the precharge command PRE).

In response to the active command Active, a corresponding word line WL in a corresponding bank is enabled. Then, the first write command Write1 enables a data write path including a corresponding bit line to write data DQ. Since the clock write latency is 5, the data DQ is written to the memory device 200 at T5 five clock cycles after the first write command Write1 at T0. The data DQ may be written to memory cells associated with the word line WL and the bit line BL before the precharge command PRE is issued at Tm.

In response to the second write command Write2, a data write path is enabled and second burst data Dset2 is written to the memory device 200 at T9. When the precharge command PRE is issued before the second burst data Dset2 is correctly written, the second burst data Dset2 has insufficient write recovery time (tWR). The word line WL that has been enabled is disabled in response to the precharge command PRE. A second write period tD2 of second burst data Dset2 is a time period measured between the first data D0 at T9 and the precharge command PRE at Tm. A first write period tD1 of first burst data Dset1 is a time period measured between the first data D0 at T5 and the precharge command PRE at Tm. Accordingly, the second write period tD2 is shorter than the first write period tD1. For example, time given to write the second burst data Dset2 is shorter than time given to write the first burst data Dset1. As a result, the second burst data Dset2 written right before the precharge command PRE may not be properly written due to insufficient write recovery time (tWR).

For instance, when a bank and a word line in the memory device 200 are activated or enabled and then, a plurality of write commands are continuously applied prior to a precharge command, the last write cycle corresponding to the last write command of the multiple write commands has a shorter data write period than that of the preceding write cycles. Therefore, a corresponding data is insufficiently written into a memory cell corresponding to the last write cycle prior to the precharge command. According to an exemplary embodiment, the arbiter 110 controls the data Dset2 of the last write cycle to be rewritten thereafter (e.g., after the precharge command). Here, "data in the last cycle" indicates the data Dset2 written right before the precharge.

For a write request, data received from the host 20 is temporarily stored in the data queue in the memory controller 100. The data corresponding to the last write cycle may be insufficiently written in the memory device 200 when there is insufficient write recovery time for the data. Therefore, the memory controller 100 does not erase the data for the last write cycle from the write queue 130 or the data queue but retains the data and rewrites the data to the same address in the memory device 200 after the precharge command.

In this operation, the arbiter 110 regenerates the write command "write (a, m, p)" as shown in FIG. 7 and applies the write command to the memory device 200. The active command "active (a, m)" is applied to the memory device 200 first to enable a bank and a word line corresponding to the write command "write (a, m, p)". For example, the arbiter 110 regenerates and applies a sequence of commands "active (a, m)" and "write (a, m, p)" to the memory device 200 to execute the write command "write (a, m, p)" executed right before the precharge, so that the rewrite operation is executed as illustrated in FIG. 8B when the write command "write (a, m, p)" has insufficient write recovery time (tWR). The operation is performed in order of FIG. 8A and FIG. 8B in time domain. Although not shown in FIGS. 8A and 8B, other commands (e.g., a read command) may be executed before the rewrite command.

FIGS. 9A through 9C are signal timing charts illustrating a data writing operation according to an exemplary embodiment of the inventive concept. FIGS. 9A through 9C also illustrate the burst write operation of DDR DRAM with a CWL of 5 and a BL of 8. For example, FIGS. 9A through 9C show a case where data is written to a word line WLn, then data is read from another word line WLn+1, and then last data is rewritten to the word line WLn.

Referring to FIGS. 9A and 9B, after data Dset1 and Dset2 are written to the word line WLn, the word line WLn is precharged by a precharge command at Tm before the word-line WLn+1 is enabled. The wordline WLn+1 is required to be enabled after a row precharge time (tRP). The row precharge time (tRP) is the number of clock cycles needed to terminate access to the enabled wordline WLn, and open access to the next wordline WLn+1. After the precharge command for the word line WLn, the word line WLn+1 is activated and then a read command Read is applied to the word line WLn+1 after a time tRCD (i.e., the number of cycles from the active command to a read/write command). Then, data is read from the word line WLn+1 a time tAA (i.e., the number of clock cycles from the read command to first data) after the read command is applied. Therefore, latency of the read command executed after the precharge is "tRP+tRCD+tAA".

After the read command is executed on the word line WLn+1, the data Dset2 that has been written to the word line WLn before the precharge of the word line WLn is rewritten as illustrated in FIG. 9C. The operations are performed in order of FIG. 9A, FIG. 9B, and FIG. 9C in time domain.

Figure 10:
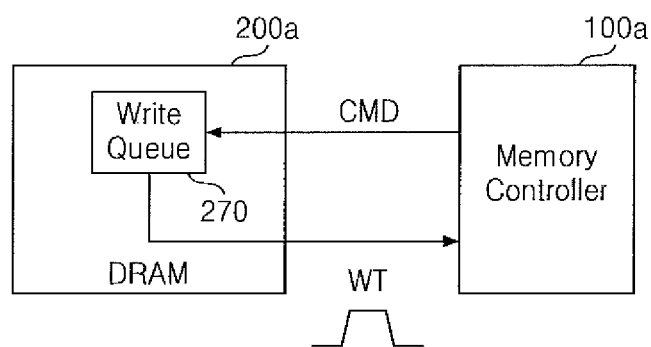
FIG. 10 is a block diagram of a memory system according to an exemplary embodiment of the inventive concept.

FIG. 10 is a block diagram of a memory system according to an exemplary embodiment of the inventive concept. Referring to FIG. 10, the memory system includes a memory controller 100a and a memory device 200a. The memory device 200a includes a write queue 270. The structure of the memory controller 100a may be similar to that of the memory controller 100 illustrated in FIG. 2. For example, the memory device 200a includes the write queue 270 in addition to the structure of the memory device 200 illustrated in FIG. 3. FIG. 10 shows a memory device 200a including the write queue 270 for storing a write command and an address and a separate storage space for storing relevant data.

The memory device 200a stores write commands received from the memory controller 100a in the write queue 270. The memory device 200a may sequentially execute the write commands stored in the write queue 270 and erase a write command entry that has been executed from the write queue 270. However, the memory device 200a may retain a write command entry for data that has been written right before a precharge command even after the execution of the write command entry. For example, when the precharge command is issued before the data is correctly written into the memory device 200a, the memory device 200a retains the write command entry for the rewriting of the data after the precharge command.

The memory device 200a may execute at least one read or write command after the precharge command and before the rewriting of the data. For example, after the precharge command and before the rewriting of the data, a different command or operation may be performed.

The memory device 200a may execute a rewrite command for rewriting the same data as that written before without intervention of the memory controller 100a. While writing data to a memory cell in response to a write command stored in the write queue 270, the memory device 200a may send a state signal WT indicating "under a write operation" to the memory controller 100a. The state signal WT is transmitted using a separate signal line between the memory controller 100a and the memory device 200a. For example, a special signal line for the state signal WT is provided between the memory controller 100a and the memory device 200a. Alternatively, the state signal WT may be transmitted using one of the existing signal lines. The memory controller 100a accesses the memory device 200a based on the state signal WT output from the memory device 200a.

Figure 11:
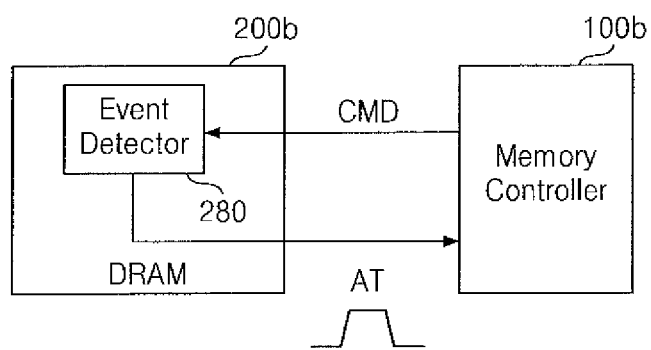
FIG. 11 is a block diagram of a memory system according to an exemplary embodiment of the inventive concept.

FIG. 11 is a block diagram of a memory system according to an exemplary embodiment of the inventive concept. Referring to FIG. 11, the memory system includes a memory controller 100b and a memory device 200b. The memory device 200b includes an event detector 280. The structure of the memory controller 100b may be similar to that of the memory controller 100 illustrated in FIG. 2. For example, the memory device 200b includes the event detector 280 in addition to the structure of the memory device 200 illustrated in FIG. 3.

The event detector 280 detects whether a precharge command is performed on a page after a write command is executed on the page. Hereafter, the page is interchangeably used as an enabled wordline. At this time, the event detector 280 sends an alarm signal AT to the memory controller 100b. The alarm signal AT informs the memory controller 100b that the write command has not been properly executed. Upon receiving the alarm signal AT from the memory device 200b, the memory controller 100b considers that an operation (e.g., a write operation right before precharge) corresponding to the alarm signal AT has not been performed and performs the operation thereafter.

According to the embodiment illustrated in FIG. 11, the memory controller 100b may apply a rewrite command to the memory device 200b in response to the alarm signal AT received from the memory device 200b so that relevant data is rewritten.

The alarm signal AT is transmitted using a separate signal line between the memory controller 100b and the memory device 200b. For example, a special signal line for the alarm signal AT is provided between the memory controller 100b and the memory device 200b. Alternatively, the alarm signal AT may be transmitted using one of the existing signal lines.

Figure 12B:
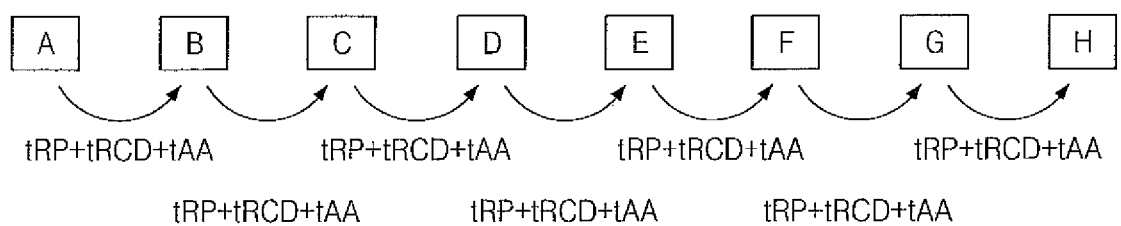
Figure 12C:
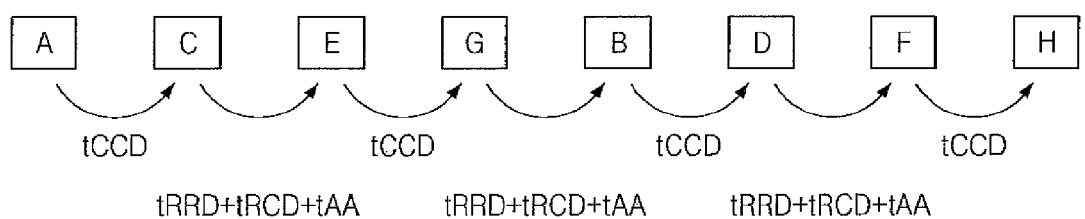

FIGS. 12A through 12C are diagrams for explaining a method of scheduling a write operation according to an exemplary embodiment of the inventive concept. According to an exemplary embodiment, a memory system schedules write operations using a write queue to reduce the number of active and precharge commands and improve performance of a memory system.

A write queue may be included within the memory controller 100 or the memory device 200, as described above. It is assumed that there are write commands A through H as shown in FIG. 12A. As shown in FIG. 12A, each of the write commands A through H includes a bank address BA, a row address RA and a column address CA. Each of the write commands A through H is for writing data to a certain address.

When the write commands A through H are stored in the write queue, the memory controller 100 may schedule them so that they are sequentially executed as shown in FIG. 12B.

Alternatively, the memory controller 100 may schedule them referring to address information as shown in FIG. 12C. For instance, the write commands A through H may be scheduled so that write commands having the same row address RA may be executed sequentially. Referring to FIG. 12C, after the write command A is executed, the write commands C, E, and G having the same row address RA as the write command A may be scheduled to be sequentially executed. Thereafter, the write command B is executed and then write commands D, F, and H having the same row address RA as the write command B may be scheduled to be sequentially executed.

In FIGS. 12B and 12C, tRP denotes a precharge command period or a precharge-to-active delay, tRRD denotes an active-to-active command period, tAA denotes an internal read command-to-first data delay, tCCD denotes a write-to-write delay, and tRCD denotes an active-to-internal read delay or an active-to-write delay.

As illustrated in FIGS. 12B and 12C, a total execution time is much longer in a case shown in FIG. 12B than in a case shown in FIG. 12C. Consequently, the total execution time can be reduced by the schedule of a plurality of write commands.

Figure 13:
FIG. 13 is a diagram for explaining a method of scheduling a write operation according to an exemplary embodiment of the inventive concept.

FIG. 13 is a diagram for explaining a method of scheduling a write operation according to an exemplary embodiment of the inventive concept. According to an exemplary embodiment, write commands having the same bank address BA and the same row address RA are sequentially executed. When no addresses include the same bank address BA and the same row address RA, write commands having the same bank address BA are sequentially executed.

When the operations of a memory device (e.g., DRAM) are scheduled according to the above-described priority, a case where write commands having the same bank address BA but different row addresses RA are sequentially executed may be prevented. As a result, the deterioration of system performance is prevented.

Figure 14:
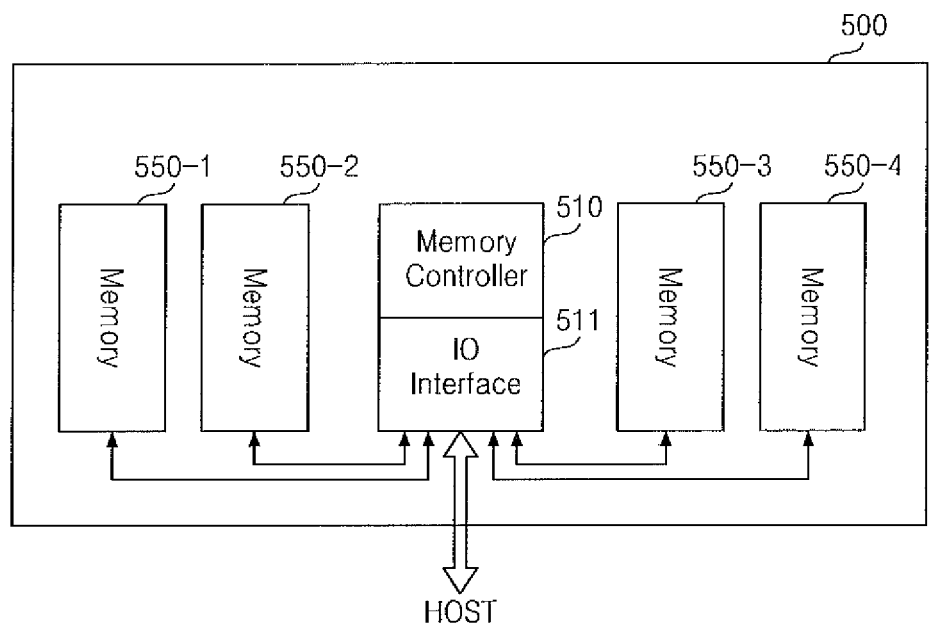
FIG. 14 is a block diagram of a module including a plurality of memory devices according to an exemplary embodiment of the inventive concept.

FIG. 14 is a block diagram of a module 500 including a plurality of memory devices 550-1 through 550-4 according to an exemplary embodiment of the inventive concept. Referring to FIG. 14, the module 500 includes a memory controller 510, an input/output (IO) interface 511, and the memory devices 550-1 through 550-4. The memory controller 510 and the IO interface 511 are disposed between a host and the memory devices 550-1 through 550-4, communicating with the host.

In an exemplary embodiment, the memory controller 510 and the IO interface 511 may be integrated in a single chip. Each of the memory devices 550-1 through 550-4 may communicate data with the host through the integrated chip.

The IO interface 511 may include an optical interface. In this case, the IO interface 511 may include an IO controller (not shown) controlling the input and output operations of the memory devices 550-1 through 550-4 and a signal converter (not shown) converting an input or output signal into an optical signal.

The IO interface 511 may transfer data using an optical fiber or a waveguide. The data is suitable for the transmission of high-speed signals, for example, complying with serial advantage technology attachment (SATA) standards and may be transmitted using wavelength division multiplexing (WDM).

Figure 15:
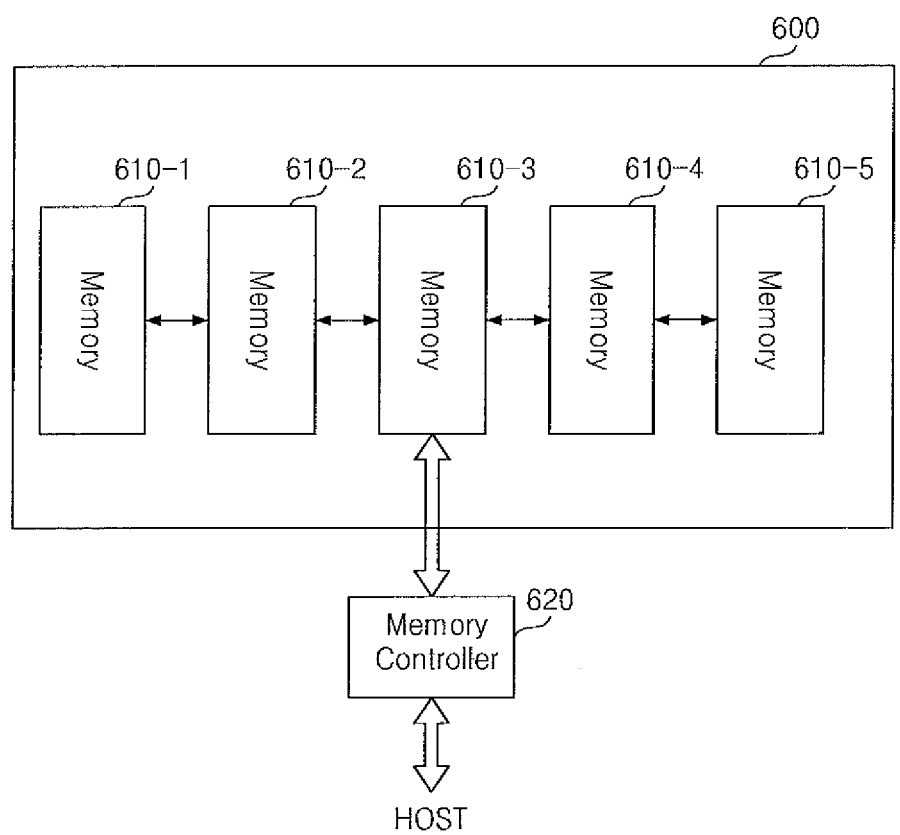
FIG. 15 is a block diagram of a module including a plurality of memory devices according to an exemplary embodiment of the inventive concept.

FIG. 15 is a block diagram of a module 600 including a plurality of memory devices 610-1 through 610-5 according to an exemplary embodiment of the inventive concept. One (e.g., 610-3) of the memory devices 610-1 through 610-5 is directly connected to and communicates with a memory controller 620. The memory devices 610-1 through 610-5 may be serially connected in a chain with one other. The memory devices 610-1, 610-2, 610-4, and 610-5 that are not directly connected to the memory controller 620 communicate with a host indirectly through the chain.

In an exemplary embodiment, the memory controller 620 controlling the operation of the memory devices 610-1 through 610-5 may implemented within the module 600 or may be stacked on the memory devices 610-1 through 610-5.

Figure 16:
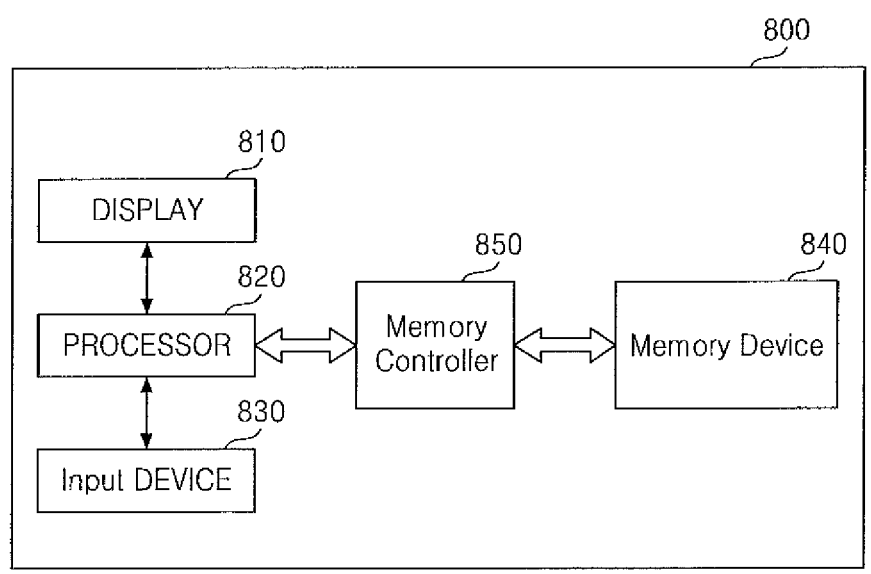
FIG. 16 is a block diagram of a data processing system including the memory device illustrated in FIG. 1 according to an exemplary embodiment of the inventive concept.

FIG. 16 is a block diagram of a data processing system 800 including the memory device illustrated in FIG. 1 according to an exemplary embodiment of the inventive concept. The data processing system 800 may be implemented as a personal computer (PC), a tablet PC, a net-book, an e-reader, a personal digital assistant (PDA), a portable multimedia player (PMP), an MP3 player, or an MP4 player.

The data processing system 800 includes the memory device 840 and a memory controller 850 controlling the data processing operations of the memory device 840.

The memory controller 850 may correspond to the memory controller 100, 100a or 100b according to an exemplary embodiment of the inventive concept, and the memory device 840 may correspond to the memory device 200, 200a, or 200b according to an exemplary embodiment of the inventive concept A processor 820 may display data stored in the memory device 840 through a display 810 according to data input through an input device 830. The input device 830 may be implemented by a pointing device such as a touch pad or a computer mouse, a keypad, or a keyboard.

The processor 820 may control the overall operation of the data processing system 800 and the operations of the memory controller 850.

Figure 17:
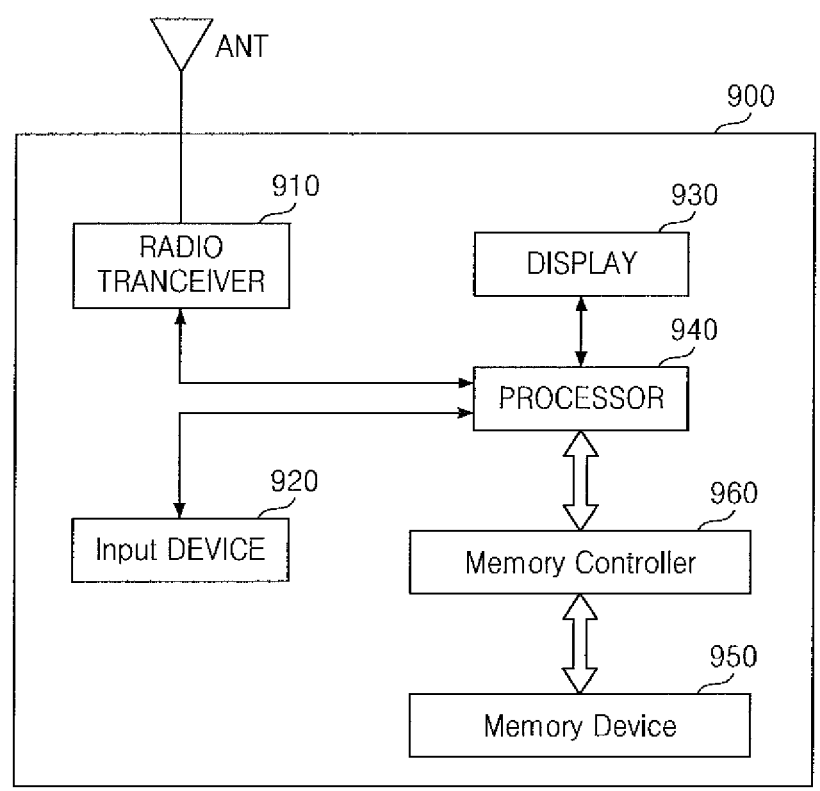
FIG. 17 is a block diagram of a data processing system including the memory device illustrated in FIG. 1 according to an exemplary embodiment of the inventive concept.

FIG. 17 is a block diagram of a data processing system 900 including the memory device 950 illustrated in FIG. 1 according to an exemplary embodiment of the inventive concept. Referring to FIG. 17, the data processing system 900 may be implemented as a cellular phone, a smart phone, a tablet personal computer (PC), a personal digital assistant (PDA) or a radio communication system.

The data processing system 900 includes the memory device 950 and a memory controller 960 controlling the operations of the memory device 950. The memory controller 960 may control the data access operations, e.g., a write operation, and a read operation, of the memory device 950 according to the control of a processor 940.

The data stored in the memory device 950 may be displayed through a display 930 according to the control of the processor 940 and/or the memory controller 960.

A radio transceiver 910 transmits or receives radio signals through an antenna ANT. The radio transceiver 910 may convert radio signals received through the antenna ANT into signals that are processed by the processor 940. Accordingly, the processor 940 may process the signals output from the radio transceiver 910 and may transmit the processed signals to the memory controller 960 or the display 930. The memory controller 960 may transmit the signals processed by the processor 940 to the memory device 950. The radio transceiver 910 may also convert signals output from the processor 940 into radio signals and may output the radio signals to an external device through the antenna ANT.

An input device 920 enables control signals for controlling the operation of the processor 940 or data to be processed by the processor 940 to be input to the data processing system 900. The input device 920 may be implemented by a pointing device such as a touch pad or a computer mouse, a keypad, or a keyboard.

The processor 940 may control the operation of the display 930 to display data output from the memory controller 960, data output from the radio transceiver 910, or data output from the input device 920.

The memory controller 960 may correspond to the memory controller 100, 100a or 100b according to an exemplary embodiment of the inventive concept, and the memory device 950 may correspond to the memory device 200, 200a, or 200b according to an exemplary embodiment of the inventive concept.

Figure 18:
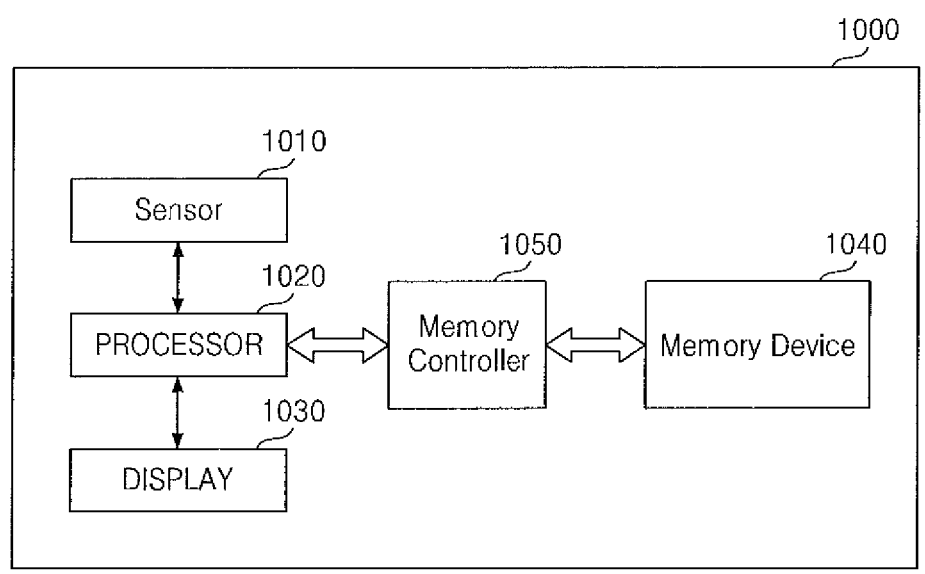
FIG. 18 is a block diagram of a data processing system including the memory device illustrated in FIG. 1 according to an exemplary embodiment of the inventive concept.

FIG. 18 is a block diagram of a data processing system 1000 including the memory device illustrated in FIG. 1 according to an exemplary embodiment of the inventive concept. The data processing system 1000 may be implemented as an image processor such as a digital camera, a cellular phone equipped with a digital camera, a smart phone equipped with a digital camera, or a tablet PC equipped with a digital camera.

The data processing system 1000 includes the memory device 1040 and a memory controller 1050 controlling the data processing operations, such as a write operation, and a read operation, of the memory device 1040. An image sensor 1010 included in the data processing system 1000 converts optical images into digital signals and outputs the digital signals to a processor 1020 or the memory controller 1050. The digital signals may be controlled by the processor 1020 to be displayed through a display 1030 or stored in the memory device 1040 through the memory controller 1050.

Data stored in the memory device 1040 may be displayed through the display 1030 according to the control of the processor 1020 or the memory controller 105.0. The memory controller 1050 may control the operations of the memory device 1040. The memory controller 1050 may correspond to the memory controller 100, 100a or 100b according to an exemplary embodiment of the inventive concept, and the memory device 1040 may correspond to the memory device 200, 200a, or 200b according to an exemplary embodiment of the inventive concept.

Figure 19:
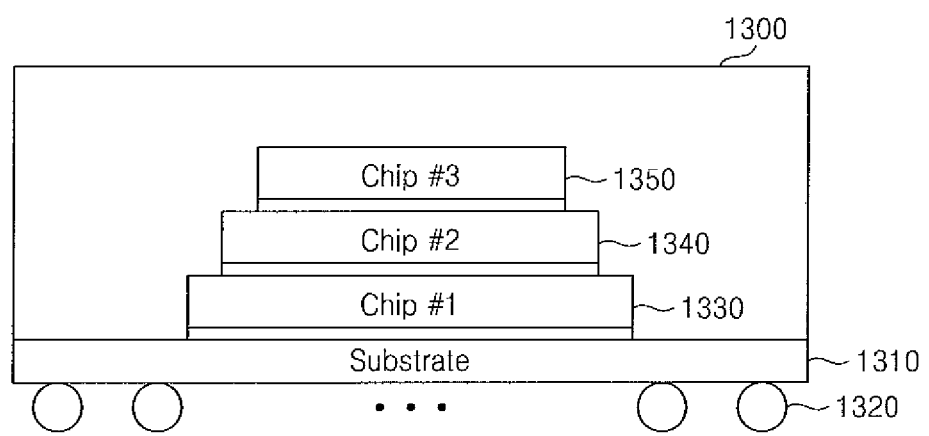
FIG. 19 is a diagram of a multi-chip package including the semiconductor memory device illustrated in FIG. 1 according to an exemplary embodiment of the inventive concept.

FIG. 19 is a diagram of a multi-chip package 1300 including the semiconductor memory device illustrated in FIG. 1 according to an exemplary embodiment of the inventive concept. Referring to FIG. 19, the multi-chip package 1300 includes a plurality of semiconductor devices, e.g., first through third chips 1330, 1340, and 1350 which are sequentially stacked on a package substrate 1310. Each of the semiconductor devices 1330 through 1350 may include a memory controller and/or a semiconductor memory device according to an exemplary embodiment. A through-silicon via (TSV) (not shown), a bonding wire (not shown), a bump (not shown), or a solder ball 1320 may be used to electrically connect the semiconductor devices 1330 through 1350 with one other.

The first semiconductor device 1330 may include a logic device die including an input/output interface and a memory controller and the second and third semiconductor devices 1340 and 1350 may include a memory device die. For example, the second and third semiconductor devices 1340 and 1350 may include a plurality of memory devices stacked on each other, and may include a memory cell array. In an exemplary embodiment, a memory device of the second semiconductor device 1340 and a memory device of the third semiconductor device 1350 may be the same or different types of memory.

Alternatively, each of the first through third semiconductor devices 1330 through 1350 may include a memory controller. In an exemplary embodiment, the memory controller may be on the same die as a memory cell array or may be on a different die than the memory cell array.

In an exemplary embodiment, the first semiconductor device 1330 may include an optical interface. A memory controller may be positioned in the first or second semiconductor device 1330 or 1340 and a memory device may be positioned in the second or third semiconductor device 1340 or 1350. The memory device may be connected with the memory controller through a TSV.

The multi-chip package 1300 may be implemented using hybrid memory cube (HMC) in which a memory controller and a memory cell array die are stacked. When the HMC is used, the performance of memory devices increases due to the increase of bandwidth and the area of the memory devices is minimized. As a result, power consumption and manufacturing cost may be reduced.

Figure 20:
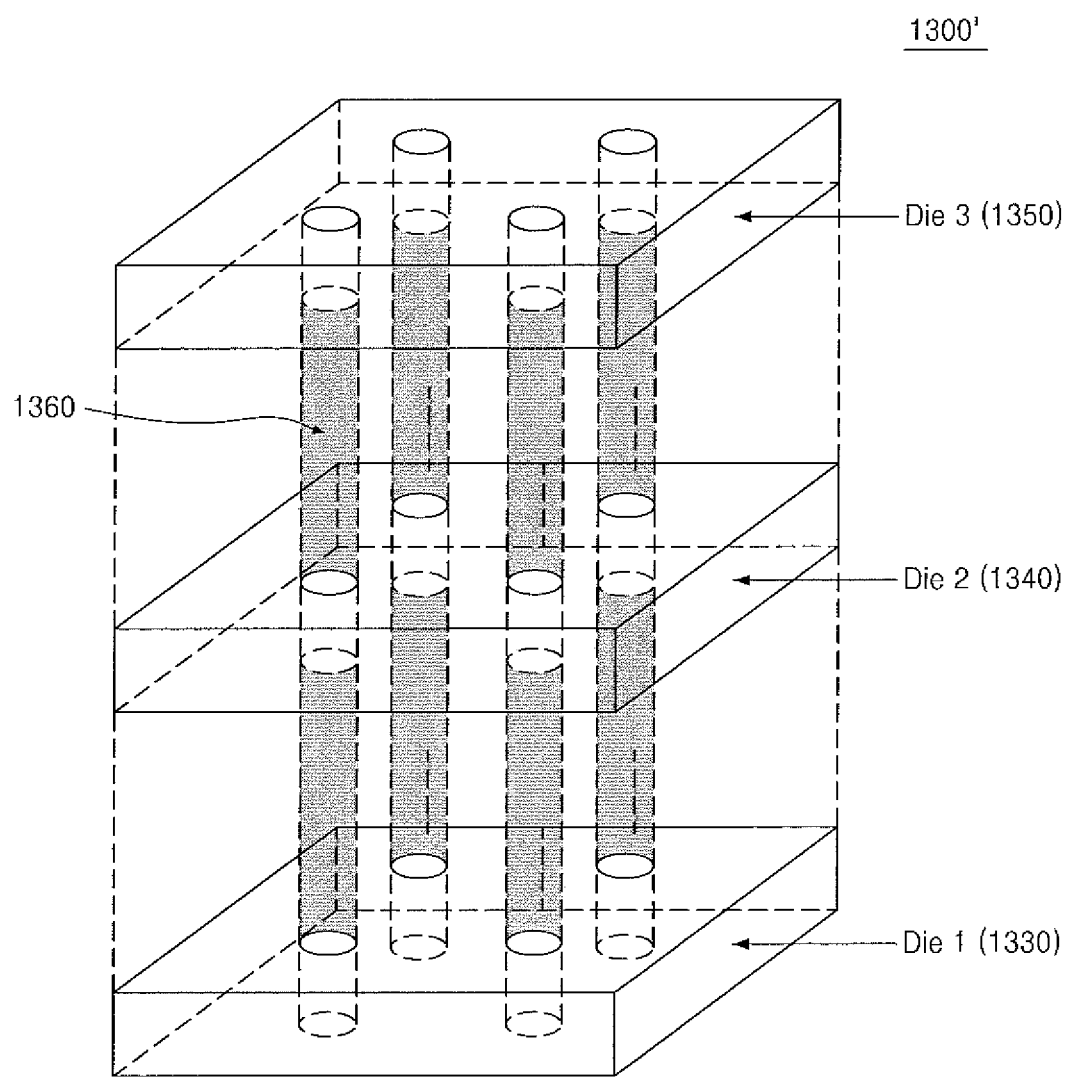
FIG. 20 is a three-dimensional conceptual diagram of an example of the multi-chip package illustrated in FIG. 19 according to an exemplary embodiment of the inventive concept.

FIG. 20 is an exemplary three-dimensional conceptual diagram of an example of the multi-chip package 1300 illustrated in FIG. 19 according to an exemplary embodiment of the inventive concept. Referring to FIG. 20, the multi-chip package 1300' includes a plurality of the dies 1330 through 1350 connected with one another through TSVs 1360 in a stack structure. Each of the dies 1330 through 1350 may include a plurality of circuit blocks (not shown) and a periphery circuit to realize the functions of the semiconductor memory device 200. The dies 1330 through 1350 may be referred to as a cell array. The plurality of circuit blocks may be implemented by memory blocks.

The TSVs 1360 may include a conductive material including a metal such as copper (Cu). The TSVs 1360 are arranged at the center of a silicon substrate. The silicon substrate surrounds the TSVs 1360. An insulating region (not shown) may be disposed between the TSVs 1360 and the silicon substrate.

The present general inventive concept can also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Also, functional programs, codes, and code segments to accomplish the present general inventive concept can be easily construed by programmers.

As described above, according to an exemplary embodiment of the inventive concept, when a write operation of data is not properly performed in a memory device, a rewrite operation of the data is performed, so that write fail problems are prevented. Therefore, the probability of write fail in the fine processes of memory devices is reduced. In addition, parameters, such as write recovery time, of memory devices (e.g., DRAM) may be efficiently released, so that the yield of memory devices can be increased with the released parameters.

While the present inventive concept has been shown and described with reference to exemplary embodiments thereof, it will be apparent to those of ordinary skill in the art that various changes in form and detail may be made therein without departing from the sprit and scope of the inventive concept as defined by the following claims.

What is claimed is:

1. A memory system comprising:
a memory device comprising a plurality of memory cells; and
a memory controller configured to issue a plurality of write commands on the memory device,
wherein the memory device performs a first write operation corresponding to a last write command of the plurality of write commands to write a data set to first memory cells, performs a precharge operation, and then, performs a second write operation corresponding to the last write command to rewrite the data set to the first memory cells, and
wherein the first write operation and the second write operation are writing the same data set to the first memory cells of the plurality of memory cells having a same address,
wherein the memory controller is configured to further issue at least one read command or at least one write command after the precharge command and before the second write operation,
wherein the memory device sends an alarm signal to the memory controller and the memory controller, in response to the alarm signal, applies the last write command to the memory device after the precharge command.

2. The memory system of claim 1, wherein the memory controller comprises:
an arbiter configured to:
receive a plurality of write requests from a host;
generate the active command, the plurality of write commands, and the precharge command;
store the plurality of write commands in a queue; and
schedule the commands stored in the queue according to a scheduling algorithm.

3. The memory system of claim 2,
wherein the queue comprises:
a write queue configured to store the plurality of write commands; and
a read queue configured to store the at least one read command.

4. The memory system of claim 3,
wherein the memory controller, after the first write operation, retains the last write command in the write queue and issues the last write command for the second write operation.

5. The memory system of claim 1, wherein the memory device further comprises an event detector configured to detect whether the precharge command is issued, and the memory device generates the alarm signal according to a result of the detection.

6. The memory system of claim 1,
wherein the memory device executes at least one read command or at least one write command after the precharge command and before the second write operation without intervention of the memory controller.

7. The memory system of claim 6,
wherein the memory device further comprises a write queue configured to store the plurality of write commands received from the memory controller.

8. The memory system of claim 7,
wherein the memory device, after the first write operation in response to the last write command, retains the last write command in the write queue to perform, in response to the last write command, the second write operation after the precharge command.

9. The memory system of claim 8,
wherein the memory device sends to the memory controller a state signal indicating that the second write operation is being executed.

10. The memory system of claim 1,
wherein the memory controller schedules write commands having a same row address to be executed sequentially from the plurality of write commands.

11. The memory system of claim 1,
wherein the memory controller schedules write commands having a same bank address and a same row address to be executed sequentially from the plurality of write commands.

12. A method of writing data to a memory device, the method comprising: activating a word line in a memory bank in response to an active command; continuously writing a plurality of data sets to memory cells associated with the word line in response to a corresponding write command of a plurality of write commands; precharging the word line after a last write command of the plurality of write commands is performed; and writing, in response to the last write command, the last data set to the memory cells after the precharge command; and executing at least one read command or at least one write command after the precharge command and before the last write command issued after the precharge command, wherein the last write command after the precharge command is performed in response to the alarm signal from the memory device.

13. The method of claim 12, further comprising storing a plurality of write commands received from a memory controller in a write queue.

14. The method of claim 13, further comprising:

removing a write command executed from the plurality of write commands stored in the write queue, wherein the last write command is retained after the precharge command and is executed after the precharge command.

15. The method of claim 12, wherein the precharging is performed in response to a precharge command issued from a memory controller or an internally generated precharge command in the memory device.

* * * * *